United States Patent
Guo et al.

(10) Patent No.: US 8,133,642 B2
(45) Date of Patent: Mar. 13, 2012

(54) METAL OPTICAL GRAYSCALE MASK AND MANUFACTURING METHOD THEREOF

(75) Inventors: Chuanfei Guo, Beijing (CN); Qian Liu, Beijing (CN); Sihai Cao, Beijing (CN); Yongsheng Wang, Beijing (CN)

(73) Assignee: National Center for Nanoscience and Technology, Beijing (CN)

(*) Notice: Subject to any disclaimer, the term of this patent is extended or adjusted under 35 U.S.C. 154(b) by 0 days.

(21) Appl. No.: 12/960,418

(22) Filed: Dec. 3, 2010

(65) Prior Publication Data
US 2011/0111331 A1    May 12, 2011

Related U.S. Application Data

(63) Continuation of application No. PCT/CN2009/001175, filed on Oct. 23, 2009.

(51) Int. Cl.
*G03F 1/00* (2006.01)
*G03F 7/00* (2006.01)

(52) U.S. Cl. ............................. 430/5; 430/322
(58) Field of Classification Search .............. 430/5, 322; 438/674
See application file for complete search history.

(56) References Cited

U.S. PATENT DOCUMENTS

| 7,436,423 B2 | 10/2008 | Mizuyama et al. |
| 2006/0263698 A1* | 11/2006 | Mizuyama et al. ............ 430/5 |
| 2007/0141838 A1* | 6/2007 | Hsiao et al. .................. 438/674 |

FOREIGN PATENT DOCUMENTS

| CN | 1556442 A | 12/2004 |
| CN | 1702547 A | 11/2005 |
| CN | 101158806 A | 4/2008 |
| CN | 101286004 A | 10/2008 |

* cited by examiner

*Primary Examiner* — Stephen Rosasco
(74) *Attorney, Agent, or Firm* — Martine Penilla Group LLP

(57) ABSTRACT

A metal optical grayscale mask includes a layer of metal film which is deposited on transparent substrate, and different transparency pattern which is formed by laser writing on the surface of the metal film. The pattern is continuous, in type of array or random pattern. The grayscale is within 3.0 OD-0.05 OD. The thickness of the metal film is 5-100 nm. A manufacturing method of the metal optical grayscale mask includes that the selected transparent substrate is rinsed by the general semiconductor rinse process, the metal film is deposited on the transparent substrate then different transparency pattern is formed by laser writing on the surface of the metal film. The pattern is continuous, in type of array or the random pattern. The grayscale mask is low in price, antistatic electricity performance is good, the resolution can surpass optical diffraction limit. The manufacturing method is simple. There is a wide band application for micro-optical components and large-scale production of micro-electro-mechanical systems.

12 Claims, 4 Drawing Sheets

US 8,133,642 B2

METAL OPTICAL GRAYSCALE MASK AND MANUFACTURING METHOD THEREOF

CLAIM OF PRIORITY TO RELATED APPLICATION

The present application claims priority under 35 U.S.C. §§120 and 365(c) as a continuation application of prior International Application No. PCT/CN2009/001175, which was filed on Oct. 23, 2009, and which was not published in English under PCT Article 21(2). The PCT/CN2009/001175 application in turn claims priority to Chinese Patent Application No. CN200910076941.2, filed on Jan. 14, 2009, entitled, "METAL OPTICAL GRAYSCALE MASK AND MANUFACTURING METHOD THEREOF". The disclosures of the prior international application and national Chinese application are herein incorporated by reference.

TECHNICAL FIELD

The present invention relates to a gray-scale photomask, and particularly relates to a gray-scale photomask comprising metal-metal oxide system which is manufactured by laser direct-writing method, and to methods of manufacturing such a gray-scale photomask.

BACKGROUND

Gray-scale photomask can be used for manufacturing 3D (three-dimensional) micro-nano structures, and particularly have large advantage in fabricating a micro-optical element. Furthermore, it also can be used for manufacturing micro-electro-mechanical systems. The three-dimensional processing with gray-scale photomask technology is achieved by changing the light transmittance at different locations of the mask so as to control the exposure intensity of the corresponding locations in photosensitive resist while exposed under light. The most outstanding gray-scale photomasks are ones based on halftone gray-scale mask and high-energy beam-sensitive (HEBS) glass, wherein the halftone gray-scale mask is manufactured with conventional photolithography method by changing the size or density of openings with a diameter on an order of sub-wavelength in Cr thin metal film such that the light transmittance of the opening can be changed in approximately continued gray-scale (Reimer K, Quenzer H J., SPIE, 1997, 3008:27902881). However, the main drawback of this method is its complex processing: it involves all steps of the conventional photolithography processing, and a high resolution photolithography is required for manufacturing the mask; furthermore, the related design in structure and the gray-scale calibration are also complicated. Another gray-scale material used widely is a HEBS glass produced by Canyon Material Inc., on which the high energy electron beam directly writing is performed, such that the unexposed portion becomes transparent, and transmittance of the exposed portion is reduced due to the silver particles created by the decomposition of the material, hence, the change in the transmittance is dependent on the exposure dose (U.S. Pat. No. 5,078,771, 1992). But it is very complicated to manufacture this material, because in the processing of this material, a zinc crown glass having a low expansion rate is used as a substrate, which is placed and heated in an acidic solution after a series of treatment, e.g. polishing etc, and after a long time of ion-exchange, a layer of complex crystal, which has a typical thickness of 3 micron is formed. Additionally, some light passivant is needed to dope with the crystal so as to widen the bandwidth of the energy band. As a result, the production cost is very high owing to the above-mentioned complicated process, and the price of gray-scale mask being made of HEBS glass further increases plus with the electron beam direct-writing under vacuum. Therefore, the high costs of the above two gray-scale masks make it difficult to apply in industry on a large scale.

Accordingly, it has very important practical value to develop a cost-effective gray-scale photomask.

SUMMARY OF THE INVENTION

Accordingly, one objective of the present invention is to provide a layer of thin metal film having a thickness of an order of nanometer ($\leqq 100$ nm) fabricated on a substrate, and a metal gray-scale photomask fabricated by directly writing on said thin metal film with a laser beam, wherein said metal gray-scale photomask has a gray-scale value in a wide range, which can be adjusted between 3.0-0.05 OD (Optical Density).

Another objective of the present invention is to provide a method for manufacturing an gray-scale mask, comprising fabricating a layer of thin metal film on a transparent substrate with thin film preparation processing, and directly forming the gray-scale photomask by using a laser directly writing on the said thin metal film. Manufacturing the gray-scale photomask can be realized just only by two-steps in this method, resulting in cost-effective gray-scale photomask.

The objectives of the present invention are carried out as follows:

A metal gray-scale photomask according to the present invention (as shown in FIG. 1) comprises a transparent substrate 12 and a layer of thin metal film 11 deposited on said transparent substrate, wherein a continuous, arrayed or any desired gray-scale pattern is formed on said thin metal film 11 using a laser direct-writing method based on a bitmap file of a pre-designed gray-scale pattern, wherein the gray-scale value of said gray-scale pattern is ranged from 3.0 OD to 0.05 OD, wherein the thickness of said thin metal film 11 is ranged from 5 nm to 100 nm.

In the above technical solution, the metal gray-scale photomask further comprises a layer of strengthening film 13 arranged on the transparent substrate 12, a layer of thin metal film 11 being deposited on said strengthening film 13 for strengthening the binding force between the thin metal film 11 and the transparent substrate 12, wherein said strengthening film 13 is made of metal Cr or Ti, and has a thickness less than 5 nm.

In the above technical solution, the metal gray-scale photomask further comprises a transparent protecting layer 14, wherein said transparent protecting layer 14 is arranged on the thin metal film 11 resulted from the directly writing of the laser for improving the durability of the gray-scale photomask; the transparent protecting layer 14 is made of ZnS—$SiO_2$, $SiO_2$ or $GeN_y$ (0.5<y<1) which meet the industrial criterion, and the thickness thereof is in a range of 10-200 nm.

In the above technical solution, the metal gray-scale photomask further comprises a layer of strengthening film 13 and a transparent protecting layer 14, wherein said strengthening film 13 is arranged on the transparent substrate 12 and the layer of thin metal film 11 is deposited on said strengthening film 13; said strengthening film 13 is made of metal Cr or Ti and has a thickness less than 5 nm; the transparent protecting layer 14 is deposited on the thin metal film 11 resulted from the directly writing of the laser and the transparent protecting layer 14 is made of ZnS—$SiO_2$, $SiO_2$ or $GeN_y$ (0.5<y<1) which meet the industrial criterion, and the thickness thereof is in a range of 10-200 nm.

In the above technical solution, said transparent substrate 12 is made of common glass, quartz glass, quartz plate, crown glass or PC plastic base with smooth surface.

In the above technical solution, said thin metal film 11 is made of Sn, In or InSn alloy; wherein the atomic ratio of In and Sn in said InSn alloy can be adjusted arbitrarily.

The method for manufacturing the the metal gray-scale photomask according to the present invention comprises the following steps:

1) rinsing a substrate: the selected transparent substrate is rinsed by conventional rinse processing of semiconductor;

2) depositing a thin metal film: a thin metal film having a thickness ranged from 5 nm to 100 nm is deposited on the transparent substrate which is rinsed in step 1), and said thin metal film is made of Sn, In or InSn alloy;

3) forming a gray-scale mask on the deposited thin metal film in step 2) by employing a laser direct-writing system based on the bitmap file of a pre-designed gray-scale pattern, which is carried out in such a direct writing manner that the thin metal film 11 is written point-by-point with pulse laser or is written line-by-line with continuous laser; wherein, the laser power is set such that the corresponding relationship between the laser power and the gray level of the objective image exhibits a monotonic function so as to realize a good corresponding relationship between the laser power and the objective gray-scale image which fulfills the requirement for preparing the 3D structure.

In the above technical solution, the method further comprises step of: 2-1) firstly, depositing a layer of strengthening film 13 on the transparent substrate 12 using a thin film depositing method, and then depositing a thin metal film 11 on said strengthening film 13 for strengthening the binding force between the thin metal film 11 and the transparent substrate 12, wherein said strengthening film 13 is made of metal Cr and has a thickness of less than 5 nm.

In the above technical solution, the method further comprises step of: 4) depositing a transparent protecting layer 14 on the metal film 11 which has been directly written with the laser in step 3 so as to improve the durability of the gray-scale photomask; the transparent protecting layer 14 is made of ZnS—$SiO_2$, $SiO_2$ or $GeN_y$ ($0.5<y<1$) which meet the industrial criterion, and the thickness thereof is in a range of 10-200 nm.

In the above technical solution, the method further comprises step of: 2-1) a layer of strengthening film 13 having a thickness of less than 5 nm is deposited on the transparent substrate 12 using a thin film depositing method, and then a thin metal film 11 is deposited on said strengthening film 13; and further comprises step of: 4) said transparent protecting layer 14 is deposited on the metal film 11, which has been directly written with the laser in step 3, wherein the transparent protecting layer 14 is made of ZnS—$SiO_2$, $SiO_2$ or $GeN_y$ ($0.5<y<1$) which meet the industrial criterion, and the thickness thereof is in a range of 10-200 nm.

In the above technical solution, said laser direct-writing method is carried out in film surface direct-writing manner or in penetrating substrate direct-writing manner wherein the film surface direct-writing is carried out by directly writing on a front side of a thin metal film by a laser beam, in which the laser beam is incident from the side of metal film and focused onto the surface of the thin metal film, and the penetrating substrate direct-writing is a manner of direct writing in which the laser is incident from the side of substrate and focused onto the thin metal film after penetrating the substrate.

Said laser direct-writing method is achieved by moving samples. After writing begins, a sample stage moves a sample disposed at the focus of an objective lens, while a laser beam is output to manufacture a gray-scale mask, by surface directly writing or directly writing through a substrate. The moving of the sample is achieved by analyzing a pattern file to be written at first, selecting an optimal writing path, generating a bitmap file which contains information such as a writing path and a corresponding relationship between the gray level and laser power etc., and then writing the sample along the writing path by outputting a corresponding power depending on the gray-scale value of the bitmap file situated at currently written location under the driving of a moving stage with a step of one nanometer, which can be achieved by one skilled in the art.

In the above technical solution, said monotonic function is set to a linear or a non-linear function depending on the requirement of the processing for manufacturing the surfaces of the 3D structure in need.

In the above technical solution, the range selected for said laser power is related to the materials of the substrate, the type and thickness of the thin metal film, wherein the laser power is in a range of 0.3-100 milliwatts and a high power corresponds to high transmittance; wherein the laser power is set such that the corresponding relationship between the laser power and the gray level of the objective image exhibits a monotonic function, and the above functional relationship can be set spatially to a variety of functions by gray-scale calibration, for example, linear function, quadratic function, and subsection function, etc., for fulfilling a good corresponding relationship between the laser power and the objective gray-scale image so as to make a 3D structure with a special curved face.

In the above technical solution, the size of the laser spot on the metal surface during writing is determined by optics diffraction-limit principle ($D=0.61\lambda/NA$, wherein D is the diameter of the laser spot, $\lambda$ is the wavelength of the laser, NA is the numerical aperture of the optics system). In general, the size of the laser spot can be larger than the optics diffraction-limit.

The range of pulse width of the pulse laser is related to the type and thickness of the metal materials. Typically, a selected range of the pulse width of the pulse laser can be $1\text{-}10^6$ nanosecond, but in principle the usable pulse width can be selected in an arbitrary period of time without limit.

The scanning speed of said continuous laser is related to the type and thickness of the metal materials, and typically is 1 microns-10 centimeters/second, but it is not limited in principle.

The step of said pulse laser beam can be arbitrarily adjusted depending on gray level, and typically it is set to 20-1000 nm. In order to write masks of continuous gray levels, the step should be controlled within the size of the laser spot, wherein the most commonly used step of moving the laser beam is in a range of 50-300 nm.

Said metal gray-scale photomask can be applied in visible light waveband and near ultraviolet waveband above 300 nm.

The thin metal film deposited on the transparent substrate according to the present invention can be transferred into corresponding oxides under the effect of heat. When the laser is acting upon the thin metal film at a point, the light energy absorbed by the film is transferred into heat so that a light induced heating oxidation occurs at the point. In an optical path system of the laser direct-writing device, the size of laser spots is definite, and the oxidation degree of the exposure point on the thin metal film can be adjusted easily by regulating the laser power and the pulse width, thus the transmittance at that point can be adjusted. The size of the action point is on the same order of the laser wavelength. The local transmittance of mask is also related to the step of moving the sample stage, and the smaller step, the higher transmittance is achieved. The occurrence of the heating oxidation in thin metal film needs a threshold value of laser power, which corresponds to the activation energy of the corresponding metal oxide or a certain oxide. The magnitude of the gray level is mainly determined by laser power above said threshold value, wherein the higher transmitting portion corresponds to higher laser power and the lower transmitting=portion corresponds to lower laser power, and the corresponding relationship exhibits a monotonic function. The existence of threshold value of the activation energy also makes it possible that the resolution in writing is lower than the size of the laser spot, and may have a minimal resolution of 100 nm.

Compared with the prior art, the present invention has advantages as follows:

The gray-scale mask based on thin metal film according to the invention only consists of two layers in structure, that is, a substrate and a thin metal film, so the components are simple. The manufacturing technology is mature, and it can be accomplished in air. The gray-scale mask is anti-static and has a good stability and a very high resolution, which reaches 100 nm. It also has an ultrafast response speed, with a minimum of less than 30 nanoseconds.

1. The metal gray-scale photomask according to the invention consists of only two layers in structure, that is, a substrate and a thin metal film, so the metal gray-scale mask can be manufacturing only by two steps, i.e. the deposition of the thin metal film and the direct writing thereof. The procedure thereof is simpler than that of the prior HEBS glass, which is very complicated and can not be achieved in two steps.

2. Because the thin metal film has an ultrafast response speed to the laser, the manufacturing processing of the mask can be completed fast. There is no need for a vacuum and electronic beam system because the processing is completed in air. Additionally, the resolution can exceed the optics diffraction-limit (up to 100 nm), which is related to activation energy of the oxidation reaction and Gauss distribution of the laser beam.

3. The laser power used in the method for manufacturing a metal gray-scale photomask according to the present invention is only on an order of milliwatt. Typically, for an amorphous substrate with low thermal conductivity, for example, glass, plastic plates, etc., a laser power in a range of 1-10 milliwatts is needed, and for a transparent crystalline substrate with better thermal conductivity, a laser power is needed to be less than 100 milliwatts, so that a great of energy can be saved.

4. Any complicated gray-scale masks with any pattern can be obtained by the method for manufacturing a metal gray-scale photomask according to the present invention, thus the cost can be decreased sharply.

5. The metal gray-scale photomask provided in the invention has a wide range of gray-scale value, which can be adjusted in a range of 3.0-0.05 OD.

6. The metal gray-scale photomask provided in the invention has a good anti-static property owing to a good electrical conductivity of the metals and related oxides.

7. The metal gray-scale photomask provided in the invention can be used in a wide range of waveband, which is ranged from 300 to 800 nm.

BRIEF DESCRIPTION OF THE DRAWINGS

FIG. 3b is an outline of a wedge-shaped microstructure fabricated by the metal gray-scale photomask in FIG. 3a.

FIG. 4b is a morphology view of a microlens array prepared using the metal gray-scale photomask in FIG. 4a.

Wherein, the numerals are referred to the following:

11—thin metal film; 12—substrate; 13—strengthening layer; 14—protecting layer

SPECIFIC MODES FOR CARRYING OUT THE INVENTION

The following detailed discussion for the metal gray-scale photomask of the present invention and the method thereof will be made in connection with the accompanying drawings.

Embodiment 1

The metal gray-scale photomask of this embodiment comprises a transparent substrate 12, and a layer of Sn thin metal film 11 deposited on the transparent substrate 12, wherein the gray-scale metal mask shown in FIG. 1 is manufactured by writing the Sn thin metal film 11 with a laser direct-writing method, and the transparent substrate 12 is made of quartz glass. The thickness of Sn thin metal film is 5 nm or 20 nm, and a laser power of 1-5 milliwatts is adopted during direct writing. The pulse width of the laser is 230 nanoseconds, and the step of moving the sample is 150 nm. The metal gray-scale photomask shown in FIG. 1 is formed by laser direct-writing on the surface of Sn thin metal film 11 or by penetrating substrate laser direct-writing.

Figure 1A:
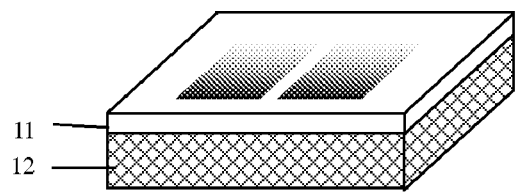
FIG. 1a shows a schematic view of the structure of a metal gray-scale photomask of the present invention.

Referring to FIG. 1a, a method for manufacturing a metal gray-scale photomask will be illustrated as follows:

First, a substrate with a smooth surface (roughness is less than 2 nm) and high transmittance (95%) is selected, such as common glass, quartz plate, crown glass or PC plastic substrates. Preferably, a quartz glass, which has a thickness of 1 mm, having a flat surface and high transmittance is used as the transparent substrate 12;

Then, the quartz glass substrate 12 is rinsed by conventional rinse processing of semiconductor, and a layer of Sn metal film 11 with thickness of 5 nm or 20 nm is deposited on the rinsed transparent substrate 12 by using a vacuum sputtering processing. An In film or InSn alloy film can also be deposited as the thin metal film 11, wherein the atomic ratio of In and Sn in InSn alloy can be adjusted at any ratio, thus resulting in a mixed film of In metal and intermetallic compound, or a mixed film of intermetallic compounds, or a mixed film of intermetallic compound and Sn metal. This thin film does not have a stratified structure, so it belongs to a monolayer. Sn thin metal film is preferred, and it has a thickness of, for example, 5 nm, 20 nm, and 100 nm;

At last, depending on the thickness of the Sn thin metal film being prepared according to this embodiment, a range of laser power used during laser direct-writing is 1-5 milliwatts, and the pulse width of the laser is 230 nanoseconds, and the step of moving the sample is 150 nm. The metal gray-scale photomask in FIG. 1 is formed by laser direct-writing on the surface of Sn thin metal film 11 or by penetrating substrate laser direct-writing. This gray-scale photomask has advantages of continuous gray levels and simple preparation. Wherein, the laser direct-writing device used for preparing the metal gray-scale photomask of the present invention is a device discussed in Chinese Patent Application No. 200720072320, for example. The direct-writing is achieved by moving sample. After writing begins, a sample stage moves together with a sample disposed at the focus of an objective lens, while a laser is output for manufacturing a gray-scale mask. First, a pattern file to be written is analyzed before writing so as to select an optimal writing path and a suitable range of gray levels, and a bitmap file is generated, wherein the bitmap file contains information such as a writing path and a corresponding relationship between the gray level and power, and then a sample is written along the writing path under a driving of moving stage with a step of one nanometer with a power corresponding to the gray-scale value of the pattern at currently written location according to the bitmap file.

Figure 2A:
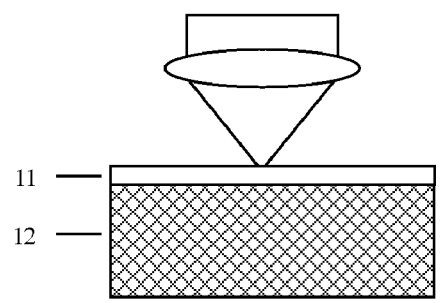
FIG. 2a shows a method of film surface direct-writing of a metal gray-scale photomask according to the invention.
Figure 2B:
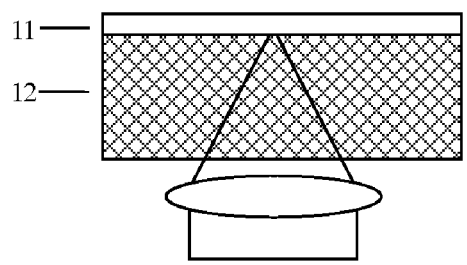
FIG. 2b shows a method of penetrating substrate direct-writing of a metal gray-scale photomask according to the invention.

Referring to FIGS. 2a and 2b, a method for manufacturing a metal gray-scale photomask comprises the steps of:

1) rinsing a substrate 12: a selected transparent substrate is rinsed by conventional rinse processing of semiconductor, for example, by ultrasonic rinse in organic solvent;

2) depositing a thin metal film 11: A Sn thin metal film 11 having a thickness of 5 nm, 20 nm or 100 nm is deposited on the transparent substrate rinsed in step 1) using vacuum sputtering thin film preparation processing;

3) forming a gray-scale mask on the deposited Sn thin metal film 11 in step 2) by employing a laser direct-writing device, for example, a device described in CN patent application No. 200720072320, wherein a writing power is selected in accordance with the actual thickness of a sample during the preparation; For example, the thickness of Sn thin metal film may be 5 nm, 20 nm, or 100 nm, and a corresponding range of laser power used during laser direct-writing is 1-5 milliwatts, 1-10 milliwatts, and 2-100 milliwatts respectively, and the size of a laser spot is 350 nm, a pulse width of the laser is 230 nanoseconds, and the step of moving the sample is 150 nm; the metal gray-scale photomask in FIG. 1 is formed by laser direct-writing on the surface of Sn thin metal film 11 or by penetrating substrate laser direct-writing.

The processing of manufacturing metal gray-scale photomasks in FIG. 1b to FIG. 1d will be described in following, which is the same as the processing in Embodiment 1.

Figure 1B:
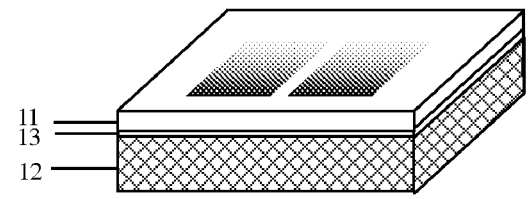
FIG. 1b shows a schematic view of the structure of another metal gray-scale photomask according to the invention (which comprises a strengthening layer).

Referring to FIG. 1b, another metal gray-scale photomask of the present invention shown in FIG. 1b is prepared, wherein the method of preparing the metal gray-scale photomask further comprises steps of: depositing a layer of strengthening film 13 being made of Cr metal on the substrate 12 using a vacuum sputtering preparation processing, and depositing a layer of Sn thin metal film 11 with a thickness of 5 nm, 20 nm or 100 nm on said strengthening film 13 for strengthening the binding force between the thin metal film 11 and the substrate 12, wherein said strengthening film 13 has a thickness less than 5 nm, such as 5 nm, 4.5 nm, 3 nm, 2.5 nm, 2 nm, or 1 nm.

Figure 1C:
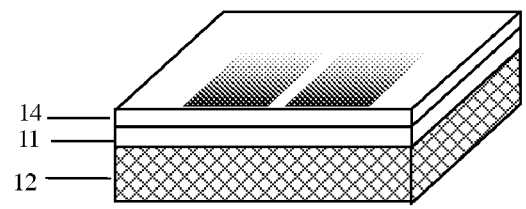
FIG. 1c shows a schematic view of the structure of another metal gray-scale photomask according to the invention (which comprises a protecting layer).

Referring to FIG. 1c, another metal gray-scale photomask of the present invention shown in FIG. 1c is prepared. The method of preparing this metal gray-scale photomask further comprises steps of: depositing a transparent protecting layer 14 on the thin metal film 11 after laser direct writing in FIG. 1a so as to improve the durability of the gray-scale photomask; the transparent protecting layer 14 in this embodiment is made of ZnS—$SiO_2$, $SiO_2$ or $GeN_y$ (0.5<y<1) which meet the industrial criterion, and the thickness thereof is in a range of 10-200 nm.

Figure 1D:
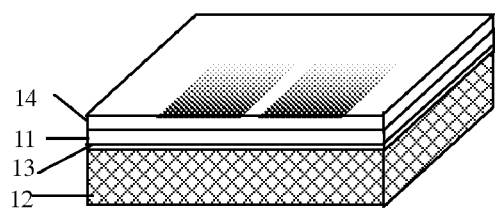
FIG. 1d shows a schematic view of the structure of yet another metal gray-scale photomask according to the invention (which comprises both a strengthening layer and a protecting layer).

Referring to FIG. 1d, yet another metal gray-scale photomask of the present invention shown in FIG. 1d is prepared. The method of preparing this metal gray-scale photomask further comprises steps of: depositing a layer of strengthening film 13 being made of Cr or Ti metal, and depositing a transparent protecting layer 14 in the metal gray-scale photomask in FIG. 1a, wherein the strengthening film 13 is arranged on the substrate 12 and a layer of Sn thin metal film 11 with a thickness of 5 nm, 20 nm or 100 nm is deposited on said strengthening film 13 for strengthening the binding force between the thin metal film 11 and the substrate 12, and then directly writing on Sn thin metal film 11, after which a transparent protecting layer 14 of ZnS—$SiO_2$ is deposited on said Sn thin metal film 11, wherein said strengthening film 13 has a thickness less than 5 nm, such as 5 nm, 4.5 nm, 3 nm, 2.5 nm, 2 nm, or 1 nm, and the transparent protecting layer 14 has a thickness of 10 nm or 50 nm.

It is not necessary that the dependence of gray level on laser power is nonlinear (or in a specific function relationship). A grayscale calibration can make the gray levels linear spatially (or in a specific function relationship so as to meet the requirement for specific-curved 3D structures) by using the nonlinear relationship between laser power and gray level.

Embodiment 2

Referring to FIGS. 2a and 2b, an In thin metal film 11 with a thickness of, for example 50 nm, is deposited on a rinsed quartz substrate 12 using DC magnetron sputtering. Then, a mask is formed by the above-mentioned laser direct-writing method, wherein the range of laser power corresponding to the above thickness is 0.3-4 milliwatts, 1-10 milliwatts, or 1-70 milliwatts, respectively. And corresponding pulse width of the laser is 100 nanoseconds, 1 micrometer or 1 millisecond and the step of moving the sample stage is 50 nm, 200 nm, or 300 nm, respectively. The other manufacturing steps are same as the corresponding steps in Embodiment 1.

Embodiment 3

Referring to FIG. 2b, a layer of Cr strengthening film with a thickness of 2 nm is deposited on a quartz glass substrate 12 using a radio-frequency magnetron sputtering method, and then, a InSn metal (atomic ratio is 1:1) thin film 11 is deposited, the thickness of which is, for example, 5 nm, 20 nm, or 100 nm; during the laser direct-writing processing, the corresponding laser power for manufacturing gray-scale masks is 1-5 milliwatts, 1-4 milliwatts, or 1-20 milliwatts. A continuous laser is used for writing with the step between lines being 350 nm. After the laser direct-writing is finished, a protecting layer 14 of ZnS—SiO$_2$ is deposited on the thin metal film 11 using a radio-frequency magnetron sputtering method, and the thickness of the protecting layer 14 is 100 nm or 200 nm. The other manufacturing steps are same as the corresponding steps in Embodiment 1.

Embodiment 4

Figure 3A:
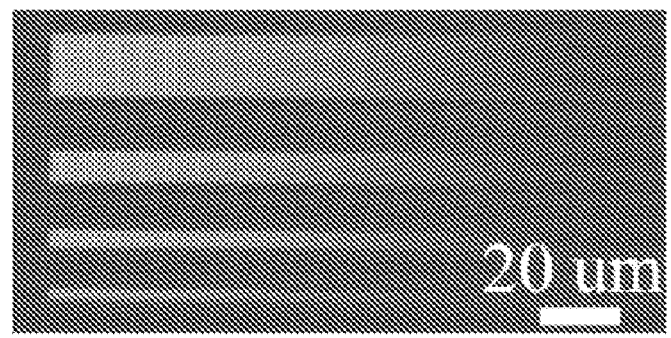
FIG. 3a shows a metal gray-scale photomask with a strip array manufactured in accordance with the invention.
Figure 3B:
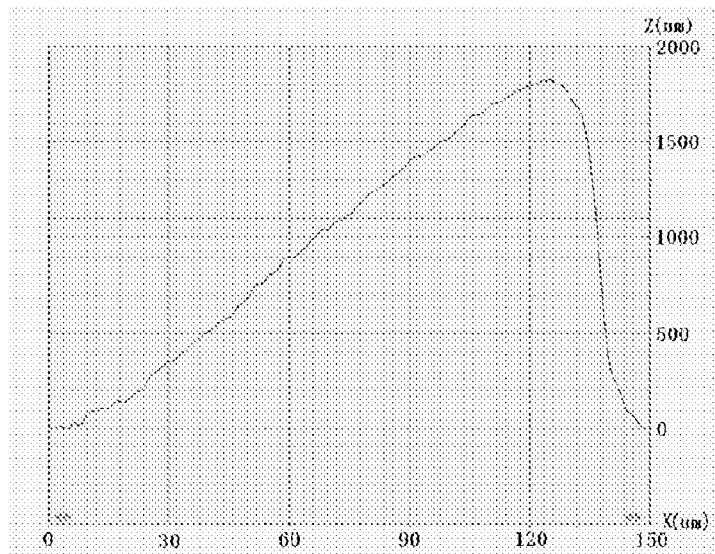
Figure 4A:
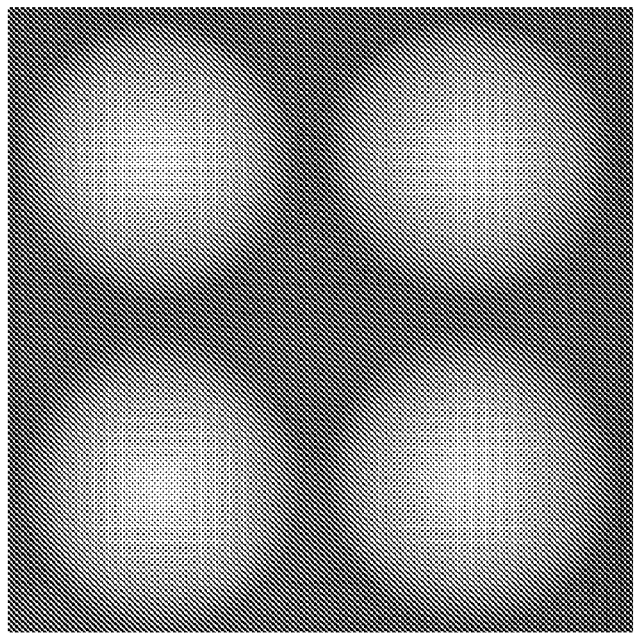
FIG. 4a shows a gray-scale mask with a circular array manufactured in accordance with the invention.
Figure 4B:
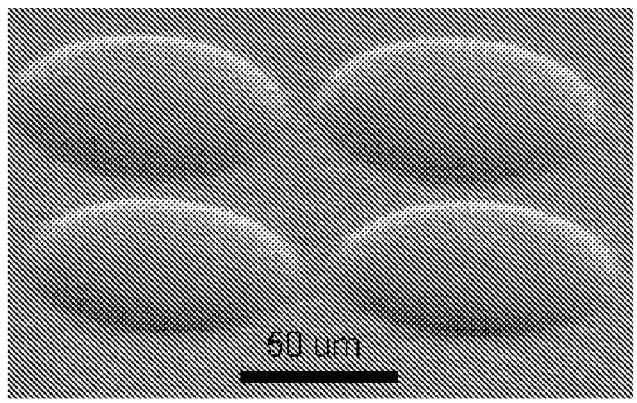

Referring to FIGS. 1, 2, 3a, 3b and 4, a Sn thin metal film 11 with a thickness of 20 nm is deposited on a rinsed quartz substrate 12. During the process of manufacturing a mask, a laser power of 1-4 milliwatts is adopted, and the pulse width is 1 millisecond, and the step of moving the sample is 100 nm. The gray-scale strip in FIG. 3a is manufactured as a mask, which is used for manufacturing a three dimensional wedge-shaped structure on a SU-8 photosensitive resist. FIG. 3b is an outline of a wedge-shaped microstructure fabricated by the metal gray-scale photomask in FIG. 3a, i.e. metal gray-scale photomask manufactured by this embodiment. The other manufacturing steps of this metal gray-scale photomask are same as the corresponding steps in Embodiment 1.

Embodiment 5

Referring to FIG. 2a, an InSn thin metal film 11 with a thickness of 30 nm is deposited on a glass substrate 12 using a radio-frequency magnetron sputtering method, wherein the mol ratio of In and Sn can be 1:9, 2:8, 4:6, 7:3 or 9.5:0.5. The manufacturing of a gray-scale mask is achieved by continuous laser direct-writing. The laser power is 1-10 milliwatts and the speed of moving a sample is 200 micros/second; or the laser power is 2-30 milliwatts and the speed of moving a sample is 10 centimeters/second. The other manufacturing steps are same as the corresponding steps in Embodiment 1.

Embodiment 6

Figure 5:
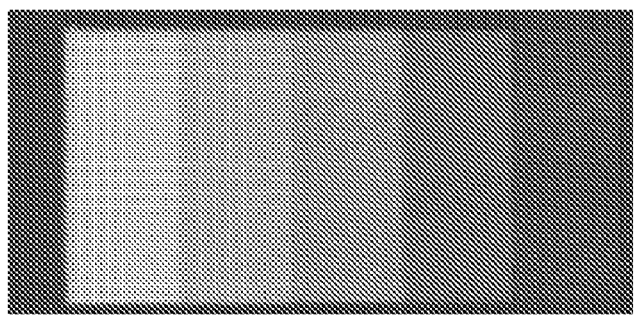
FIG. 5 shows a metal gray-scale photomask with 5 levels manufactured in accordance with the invention.

Referring to FIGS. 2b and 5, an In thin metal film 11 with a thickness of 20 nm is deposited on a glass substrate 12 using a radio-frequency magnetron sputtering method. During the process of manufacturing a gray-scale mask, a laser power of 2-8 milliwatts is adopted, and the pulse width of the laser is 200 nanoseconds, and the step size of moving the sample is 150 nm. The resulting mask will be a complicated bright field gray-scale mask. And a protecting layer of SiO$_2$ with a thickness of 20 nm is deposited on the surface of the thin metal film 11. The other manufacturing steps are same as the corresponding steps in Embodiment 1.

Embodiment 7

Figure 6:
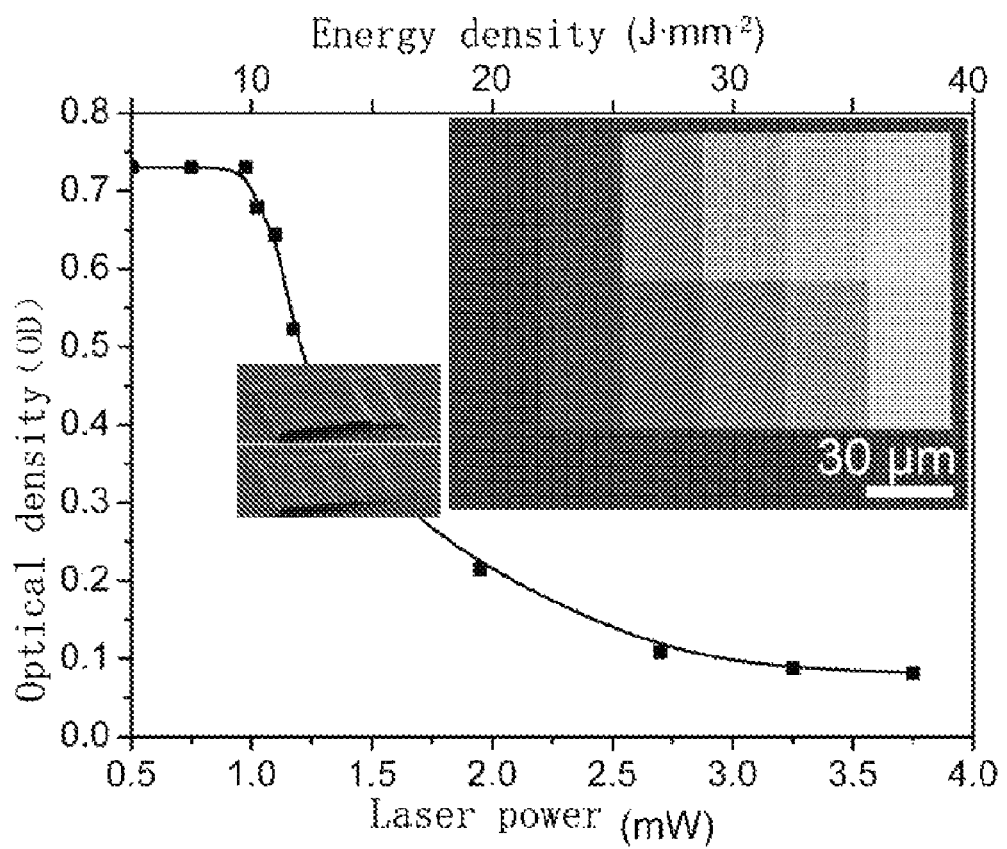
FIG. 6 shows a relationship between OD and power of a metal gray-scale photomask made from Sn thin film with a thickness of 20 nm, and shows masks and corresponding morphology views of 3D structures before and after the gray-scale calibration respectively.

Referring to FIGS. 2 and 6, a Sn thin metal film 11 with a thickness of 20 nm is deposited on a quartz glass substrate 12 using a radio-frequency magnetron sputtering method. During the process of manufacturing a gray-scale mask, a laser power of 0.5-3.75 milliwatts is adopted, and the pulse width the laser is 1 nanosecond, and the step of moving the sample is 200 nm. The resulting mask has five gray scales. Wherein FIG. 6 is a curve, which shows the relationship between the laser power and the optical density corresponding to the mask, and shows the gray-scale masks before and after a non-linear gray-scale calibration and the three dimensional microstructures it manufactured, proving that the gray-scale calibration is effective. The other manufacturing steps are same as the corresponding steps in Embodiment 1.

Embodiment 8

Figure 7:
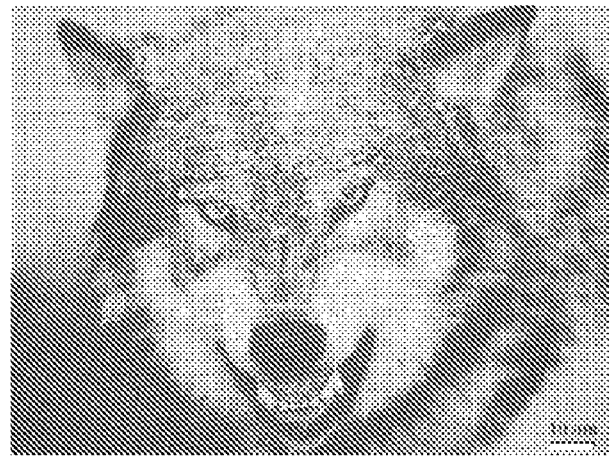
FIG. 7 shows a metal gray-scale photomask having an random pattern manufactured in accordance with the invention.

Referring to FIGS. 2 and 7, a Sn thin metal film 11 with a thickness of 20 nm is deposited on a quartz glass substrate 12 using a radio-frequency magnetron sputtering method. The laser power is 3-8 milliwatts, and the pulse width of the laser is 230 nanoseconds, and the step of moving the sample is 150 nm. The other manufacturing steps are same as the corresponding steps in Embodiment 1.

The gray-scale mask of the present invention is based on the fact that metal materials are opaque and the thin metal film with a thickness on an order of nanometer has a low transmittance. However, a number of metal oxides are transparent, especially the metal oxides with high transmittance, for example, tin oxide and indium oxide, etc. In view of a considerable optical difference between the thin metal films and the metal oxides films, the graded transmittance can be achieved by changing the ratio of metal and its oxide gradually at different positions of the film, and the oxidation degree at respective positions of the metal film can be adjusted by controlling the laser power, the pulse width or the step size of moving the sample stage based on the gray-scale value of the corresponding objective patterns, so that the transparency can be regulated, thus a metal gray-scale mask is formed eventually. In, Sn and InSn alloy thin films are used as a gray-scale medium for the metal gray-scale photomasks in the present invention.

The present invention can have various implementations for example, besides magnetron sputtering, the methods for depositing the thin metal film also can be ion sputtering, electron beam evaporation, laser beam evaporation or heat evaporation, etc. The materials of substrate can be of a good variety, which include a number of inorganic or organic materials, for example, the substrate can be made of common glass, quartz glass, quartz plate, crown glass or PC plastic material, etc. In the above embodiments, besides the film surface direct-writing, the laser direct-writing method also can be penetrating substrate direct-writing, wherein the film surface direct-writing is carried out by directly writing on a front side of a thin metal film, in which a laser beam is directly focused onto the surface of the thin metal film without penetrating a substrate, and the penetrating substrate direct-writing is such a direct writing that the laser beam is incident from the side of substrate and is focused onto the surface of thin metal film after penetrating the substrate, as can be achieved by one skilled in the art.

The controlling of the gray level in the preparation method of the invention is achieved by regulating the pulse laser power on objective positions, the size of the laser spots, the pulse width and the step size of moving sample, or by regulating the laser power of continuous laser on objective positions, the size of the laser spots and the scanning speed.

The invention can certainly have other embodiments, and it can be understood by those skilled in the art that various changes and modifications may be made according to the invention without departing from the spirit and scope of the present invention, and these changes and modifications should fall into the scope of the invention defined in the appended claims.

The invention claimed is:

1. A metal gray-scale photomask, comprising: a transparent substrate (12) and a layer of thin metal film (11) deposited on said transparent substrate, characterized in that, a continuous, arrayed or any desired gray-scale pattern is formed on said thin metal film (11) using laser direct-writing method based on a bitmap file of a pre-designed gray-scale pattern, and gray-scale value of said gray-scale pattern is ranged from 3.0 OD to 0.05 OD, wherein a thickness of said thin metal film (11) is ranged from 5 nm to 100 nm.

2. The metal gray-scale photomask according to claim 1, characterized in that, further comprising a layer of strengthening film (13) arranged on the transparent substrate (12), and the layer of thin metal film (11) being deposited on said strengthening film (13), wherein said strengthening film (13) is made of metal Cr or Ti and has a thickness of less than 5 nm.

3. The metal gray-scale metal mask according to claim 1, characterized in that, further comprising a transparent protecting layer (14), said transparent protecting layer (14) being arranged on the thin metal film (11) which is directly written with a laser; wherein the transparent protecting layer (14) is made of ZnS—SiO$_2$,SiO$_2$ or GeN$_y$(0.5<y<1) which meet an industrial criterion, and the thickness of the transparent protecting layer (14) is in a range of 10-200 nm.

4. The metal gray-scale photomask according to claim 1, characterized in that, further comprising a layer of strengthening film (13) and a transparent protecting layer (14), wherein said strengthening film (13) is arranged on the transparent substrate (12) and the layer of thin metal film (11) is deposited on said strengthening film (13); wherein said strengthening film (13) is made of metal Cr or Ti and has a thickness of less than 5 nm; the transparent protecting layer (14) is deposited on the metal thin film (11) which is directly written with a laser, and said transparent protecting layer is made of ZnS—SiO$_2$,SiO$_2$ or GeN$_y$(0.5<y<1) which meet the industrial criterion, and the thickness of the transparent protecting layer (14) is in a range of 10-200 nm.

5. The metal gray-scale photomask according to claim 1, characterized in that, said transparent substrate (12) is made of common glass, quartz glass, quartz plate, crown glass or PC plastic material with a smooth surface.

6. The metal gray-scale photomask according to claim 1, characterized in that, said thin metal film (11) is Sn, In or alloy InSn thin film.

7. A method for manufacturing a metal gray-scale photomask, the method comprising steps of:
1) rinsing a substrate: a selected transparent substrate being rinsed by conventional rinse processing of semiconductor;
2) depositing a thin metal film: a thin metal film having a thickness ranged from 5 nm to 100 nm being deposited on the transparent substrate which is rinsed in step 1) by using thin film depositing processing, and said thin metal film being made of Sn, In or InSn alloy;
3) forming a gray-scale mask on the deposited thin metal film in step 2) by using a laser direct writing system based on the bitmap file of a pre-designed gray-scale pattern, which is carried out in such a direct writing manner that the thin metal film (11) is written point-by-point with pulse laser or is written line-by-line with continuous laser; wherein, the laser power is set such that the corresponding relationship between the laser power and the gray level of an objective image exhibits a monotonic function so as to realize a good corresponding relationship between the laser power and the objective gray-scale image, which fulfills the requirement for preparing a 3D structure.

8. The method for manufacturing a metal gray-scale photomask according to claim 7, characterized in that, further comprising the step of: 2-1) depositing a layer of strengthening film (13) on the substrate (12) by using film deposition processing, wherein the strengthening film (13) has a thickness of less than 5 nm; and depositing the layer of thin metal film (11) on said strengthening film (13), wherein said strengthening film (13) is made of metal Cr or Ti.

9. The method for manufacturing a metal gray-scale photomask according to claim 7, characterized in that, further comprising the step of: 4) depositing a transparent protecting layer (14) on the metal film (11) which has been directly written with the laser in step 3); wherein the transparent protecting layer (14) is made of ZnS—SiO$_2$, SiO$_2$ or GeN$_y$ (0.5<y<1) which meet the industrial criterion, and the thickness thereof is in a range of 10-200 nm.

10. The method for manufacturing a metal gray-scale photomask according to claim 7, characterized in that, further comprising the step of: 2-1) depositing a layer of strengthening film (13) on the transparent substrate (12), wherein the strengthening film (13) has a thickness of less than 5 nm; and depositing the layer of thin metal film (11) on said strengthening film (13); and further comprising the step of: 4) depositing a transparent protecting layer (14) on the metal film (11) which has been directly written with the laser in step 3); the transparent protecting layer (14) is made of ZnS—SiO$_2$, SiO$_2$ or GeN$_y$(0.5<y<1) which meet the industrial criterion, and the thickness thereof is in a range of 10-200 nm.

11. The method for manufacturing a metal gray-scale photomask according to claim 7, characterized in that, said transparent substrate (12) is made of common glass, quartz glass, quartz plate, crown glass or PC plastic material with a smooth surface.

12. The method for manufacturing a metal gray-scale photomask according to claim 7, characterized in that, said thin metal film (11) is Sn, In or InSn alloy thin film.

* * * * *